(12) United States Patent
Conti et al.

(10) Patent No.: US 6,847,203 B1
(45) Date of Patent: Jan. 25, 2005

(54) APPLYING PARAMETRIC TEST PATTERNS FOR HIGH PIN COUNT ASICS ON LOW PIN COUNT TESTERS

(75) Inventors: Dennis R. Conti, Essex Junction, VT (US); John Lafferty, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,230

(22) Filed: Jul. 2, 2003

(51) Int. Cl.[7] ............................................. G01R 31/26
(52) U.S. Cl. ..................... 324/158.1; 324/765; 714/726
(58) Field of Search ............................... 324/73.1, 754, 324/765, 158.1; 714/718–719, 724, 726–727, 733–735

(56) References Cited

U.S. PATENT DOCUMENTS

| | | |
|---|---|---|
| 3,922,537 A | 11/1975 | Jackson |
| 4,094,568 A | 6/1978 | Lee et al. |
| 4,884,287 A | 11/1989 | Jones et al. |
| 4,939,454 A | 7/1990 | Miner |
| 5,000,692 A | 3/1991 | Taniguchi et al. |
| 5,450,017 A | 9/1995 | Swart |
| 5,754,823 A | 5/1998 | Mudryk, Jr. et al. |
| 5,898,314 A | 4/1999 | Swart |
| 5,909,450 A | 6/1999 | Wright |
| 5,936,415 A | 8/1999 | Fredrickson |
| 5,952,839 A | 9/1999 | Fredrickson |
| 5,973,504 A | 10/1999 | Chong |
| 6,192,496 B1 | 2/2001 | Lawrence et al. |
| 6,247,155 B1 | 6/2001 | Wright |
| 6,260,163 B1 * | 7/2001 | Lacroix et al. .............. 714/726 |
| 6,348,789 B1 | 2/2002 | Terao |
| 6,446,228 B1 | 9/2002 | Kobayashi |
| 6,448,796 B1 * | 9/2002 | Ellison et al. .............. 324/754 |

FOREIGN PATENT DOCUMENTS

GB    2342722 A    4/2000

OTHER PUBLICATIONS

'Special Test Chip For Testing IC Tester', IBM Technical Disclosure Bulletin, vol. 28, No. 1, Jun. 1985, pp. 221–222.
'N–Way Testpoint For Complex LSI Design', IBM Technical Disclosure Bulletinl, vol. 13, No.10, Mar. 1972, pp. 2937–2938.

* cited by examiner

*Primary Examiner*—Minh N. Tang
(74) *Attorney, Agent, or Firm*—McGinn & Gibb, PLLC; Robert A. Walsh, Esq.

(57) ABSTRACT

Disclosed is an integrated circuit chip test apparatus that has a module test fixture having contact pads that are adapted to make contact with signal input/output pins on an integrated circuit chip being tested. An intermediate banking box is connected to the module text fixture and a tester is connected to the intermediate banking box. The tester includes at least one bank of channels there are more pins on the integrated circuit chip than there are channels in the tester. The intermediate banking box includes switches that are connected between the contact pads and the channels. The switches are adapted to selectively connect a subset of the contact pads to the channels to connect the tester to a subset of pins, thereby allowing the tester to test a portion of the integrated circuit that corresponds to the subset of pins.

20 Claims, 9 Drawing Sheets

APPLYING PARAMETRIC TEST PATTERNS FOR HIGH PIN COUNT ASICS ON LOW PIN COUNT TESTERS

BACKGROUND OF INVENTION

1. Field of the Invention

The present invention generally relates to integrated circuit chip testers and more particularly to a universal banking box of switches that allow products to be tested on testers with fewer tester channels a product under test has pins.

2. Background of Invention

A product-design-specific Test Manufacturing Data (TMD) file is required for each ASIC logic product design. Since the TMD file is design-specific, creation of this file is typically the customers responsibility (some manufacturers offer Test Generation as a design service for ASIC customers). The TMD file contains a number of design-specific elements, including a complete gate-level logic model of the design and all the design-specific test patterns required to verify correct fabrication of the design.

For some ASIC products, the TMD contains reduced pin count test (RPCT) patterns for the logic circuitry, cores, and embedded memory that are internal to a boundary scan chain. These test patterns use a reduced number of product pins, called test I/O, that allow these internal tests to be applied using a low pin count tester. The TMD also includes an explicit external I/O test pattern subset that is used to test the logical and parametric functionality of the off-chip driver and receiver circuits that fall outside of the logical enclosure created by the boundary scan logic structure. These external I/O test patterns are generated under the assumption that all of the products signal I/O pins will be simultaneously contacted during test. This assumes the external I/O test patterns will be applied by a full pin count tester with as many test channels as the product has signal I/O pins. Although the internal tests can be applied with a low pin count tester, this assumes the external I/O tests would still require the high pin count tester.

The number of test channels on the tester has a direct relationship on the cost of Automatic Test Equipment (ATE). As an example, the International Technology Roadmap for Semiconductors (ITRS) estimates the cost of each reduced function (DC) tester channel to be $200. Adding 2048 DC channels to a RPCT tester would increase its cost by $409,600. Presently, when products have pin counts and volumes that exceed the capacity of existing testers, expensive higher pin count testers must be purchased. Future technology offerings will lead to products with even higher pin counts.

SUMMARY OF INVENTION

The present invention comprises an integrated circuit chip test apparatus that has a module test fixture having contact pads. The contact pads are adapted to make contact with signal input/output pins on an integrated circuit chip being tested. An intermediate banking box is connected to the module text fixture and a tester is connected to the intermediate banking box. The tester includes at least one bank of channels. There are more of the pins on the integrated circuit chip than there are channels in the tester. The intermediate banking box includes switches connected between the contact pads and the channels. The switches are adapted to selectively connect a subset of the contact pads to the channels to connect the tester to a subset of pins, thereby allowing the tester to test a portion of the integrated circuit that corresponds to the subset of pins. The selected channels are dedicated to specific pins and are not switched to different pins during chip testing. Flex channels can change to which pin connections the dedicated channels are dedicated when testing different types of chips. The intermediate banking box has a multiplexor controller for coordinating the connections of the banks. The banks are connected in parallel within the banking box.

A full chip test program supplied to the tester is modified by the tester such that the tester sequentially applies portions of the full chip test program to portions of the integrated circuit as limited by the number of channels. The intermediate banking box is adapted to be connected to a plurality of different module text fixtures associated with different types of integrated chips to be tested, such that the intermediate banking box can be used to test a plurality of different pin style integrated circuit chips.

BRIEF DESCRIPTION OF DRAWINGS

The foregoing invention will be better understood from the following detailed description with reference to the drawings, in which.

DETAILED DESCRIPTION

Figure 1:
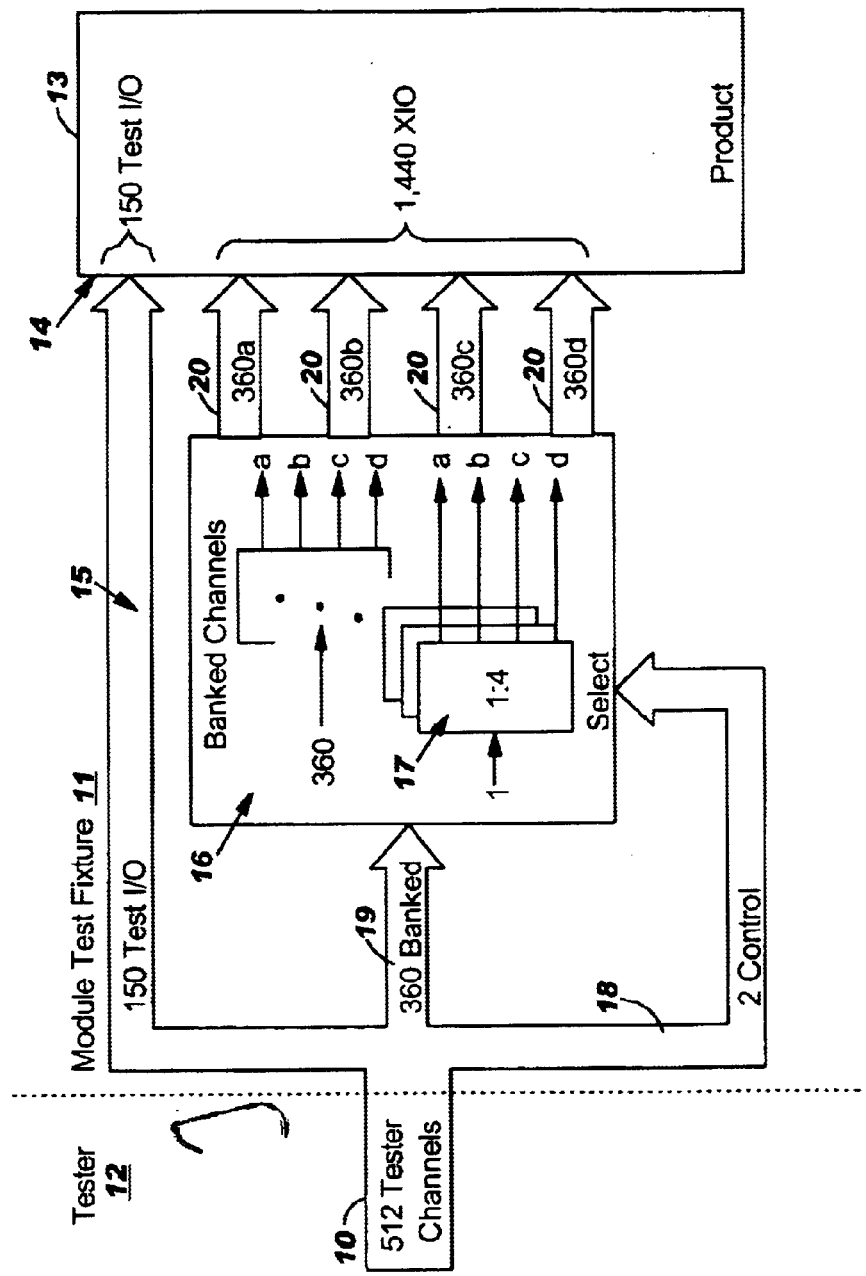
FIG. 1 is a schematic diagram of module banking.

This invention presents a Reduced Pin Count Test design and test methodology that allows parametric test patterns for high pin count ASICs to be applied using low pin count testers. The same boundary scan structure used to isolate the test of internal logic to a small number of test I/O is also used to apply parametric external I/O tests to the ASICs functional I/O. The parametric tests are banked into pin groups and applied on the same low pin count tester used for the internal logic tests. This results in substantial manufacturing test cost savings without loss of parametric fault coverage or test quality.

Using ASIC design and test methodologies, the parametric test patterns for high pin count products can be banked and applied by low pin count testers. The process used for "banking" is explained later in this paper. Complete parametric fault coverage is retained, thus allowing high quality test while avoiding the manufacturing cost of purchasing and operating high pin count testers. All types of I/O books are supported including pairs of CMOS differential I/O and voltage reference I/O. Manufacturing banks the parametric test patterns after the customer has completed Automatic Test Pattern Generation (ATPG). The ATPG can occur without knowledge of how the test patterns will be banked for application by a low pin count tester.

The ASIC boundary scan design supports reduced pin testing in a fashion similar to IEEE 1149.1. The ASIC boundary scan design differs in that it uses LSSD scan chains in place of the dedicated test access port. The ASIC boundary scan chain is an LSSD chain that, like IEEE 1149.1, separates the device test into two testable regions. The region internal to the boundary scan chain consists of all the logic circuitry, embedded memory, and cores. This internal region can be fully tested using a reduced number of test pins such as test control inputs, scan chain I/O, and test I/O. The region external to the boundary scan chain contains the same internal test controls and I/O. It also includes all the external I/O pins. These are all the remaining functional and data I/O on the product.

Most external I/O are bi-directional pins with their receiver, driver, and enable controls wired to RPCT test I/O and latches in the boundary scan chain. The external I/O are wired independently of other external I/O. Each of these external I/O can be tested individually by using only the one external I/O, the RPCT test I/O, and the boundary scan chain. Alternately, given their independence, the tests of several external I/O can be merged and tested together by the same test pattern.

There are also specialized external I/O books that are dependent on other external I/O. Differential I/O have a true pin and a complement pin. During a receiver test, the true and complement pins must receive opposite binary stimuli. Both pins must receive these simultaneous stimuli during their test patterns. The differential I/O pins must be tested together.

Some external I/O books are dependent on a voltage reference sourced from the tester through another external input. The reference input must be held at the required voltage for any external I/O tests that involve an I/O using the reference voltage. There are sometimes large numbers of such I/O (e.g., 200). The most practical way to satisfy this requirement is to have the voltage reference input active for the test of any group of the external I/O pins.

The region external to the boundary scan chain contains minimal logic circuitry such as the I/O receiver and driver controls and the wiring of the external I/O data lines to multiplexers and the boundary scan chain. This external region can be fully tested using the test controls, boundary scan chain and the external I/O pins. Much of the external region can be tested using an I/O wrap test. I/O wrap test patterns launch stimuli from the boundary scan chain, wrap the stimuli through the bi-directional external I/O, and observe the result by capturing it back in the boundary scan chain. Since there is little circuitry under test in this region, a small number of the I/O wrap test patterns are required. In addition to the I/O wrap test, external I/O tests can be used to test the off-chip drivers and on-chip receivers within the external I/O books. The external I/O tests also have a rather simple structure requiring a relatively small number of test patterns.

The ATPG for the external I/O tests targets special parametric faults to specifically test off-chip drivers and receivers. The ATPG tool also segregates the external logic (that connected to the external I/O plus the necessary test control logic). By targeting only the parametric faults and using only the external logic, the ATPG patterns are very structured and very simple, either applying tester stimulus to the external inputs, observing them in the boundary latches, or else measuring the external drivers after applying the driver enable and data signals from the boundary scan latches.

The ATPG additionally generates a few patterns to test any remaining stuck faults in the external logic, such as the boundary scan multiplexers. These patterns are also very simple and structured due to the nature of the boundary scan.

As shown in FIG. 1, banking is a method that switches a predefined group of tester channels 10 between "active" (connected) and "inactive" (unconnected) groups of pins on the product. One banking technique is implemented directly on the module test fixture 11 (device interface board). As an example, a module test fixture 11 with banking can extend a tester 12 with 512 tester channels 10 to test a product 13 with 1,592 test pins 14. To begin, 150 tester channels could be fixed to always contact 150 of the products pins to handle the RPCT test I/O. Configuring the banking 16 can use a 1:4 multiplexer 17. Two tester channels 18 are needed to control the banking multiplexor 17 on the module test fixture 11. The remaining 360 tester channels 19 can be switched between four banked groups 20. Each banked group 20, when active, would connect to 360 external I/O pins 14 on the product 13. The 1:4 multiplexed banking 16 extends the 360 tester channels to support test of 1,440 product pins 14. Therefore, the 150 fixed channels 15 plus the 360 channels 19 banked to four groups 20 extends the 512 pin tester to test products 13 with up to 1,590 pins.

A more complex example (shown in FIG. 2) could include testing a product 13 that has both voltage references and differential I/O 24. For instance, the above example could be modified to include 20 product voltage references and one differential I/O 24 that resides outside the 150 test I/O 15. Once again the 150 product test I/O 15 are fixed to always contact 150 tester channels; the 20 voltage references 24 are treated in the same manner. A total of 170 tester channels have now been accounted for, this leaves 342 channels to act as banked channels 16 and as the control 18 for the banked channels. Allowing two channels for control 18 provides 340 tester channels 23 capable of contacting 1,360 product pins 14. This is accomplished by configuring the banking switches as 1:4 multiplexers 17. With this approach, the total product pin count that can be tested by a 512 pin tester is 1,530 pins. To address the differential I/O requirement, the differential I/O true and complement pins must be paired by connecting them to the same port on two different multiplexers. This will insure that both pins of the differential I/O are connected and disconnected to the tester as a pair.

Implementing the examples above would require 1,440 and 1360 switches respectively. Each subdivision of four switches is arranged to form a 1:4 analog multiplexer 17. As product pin counts increase, the banking implementation on the module test fixture is limited. The increased number of switches required will exceed the available area on the module test fixture. Also, each module test fixture is specifically designed to meet the needs of its intended product. This leads to a custom module test fixture and lead time issues associated with the design and fabrication of this module test fixture.

Figure 2:
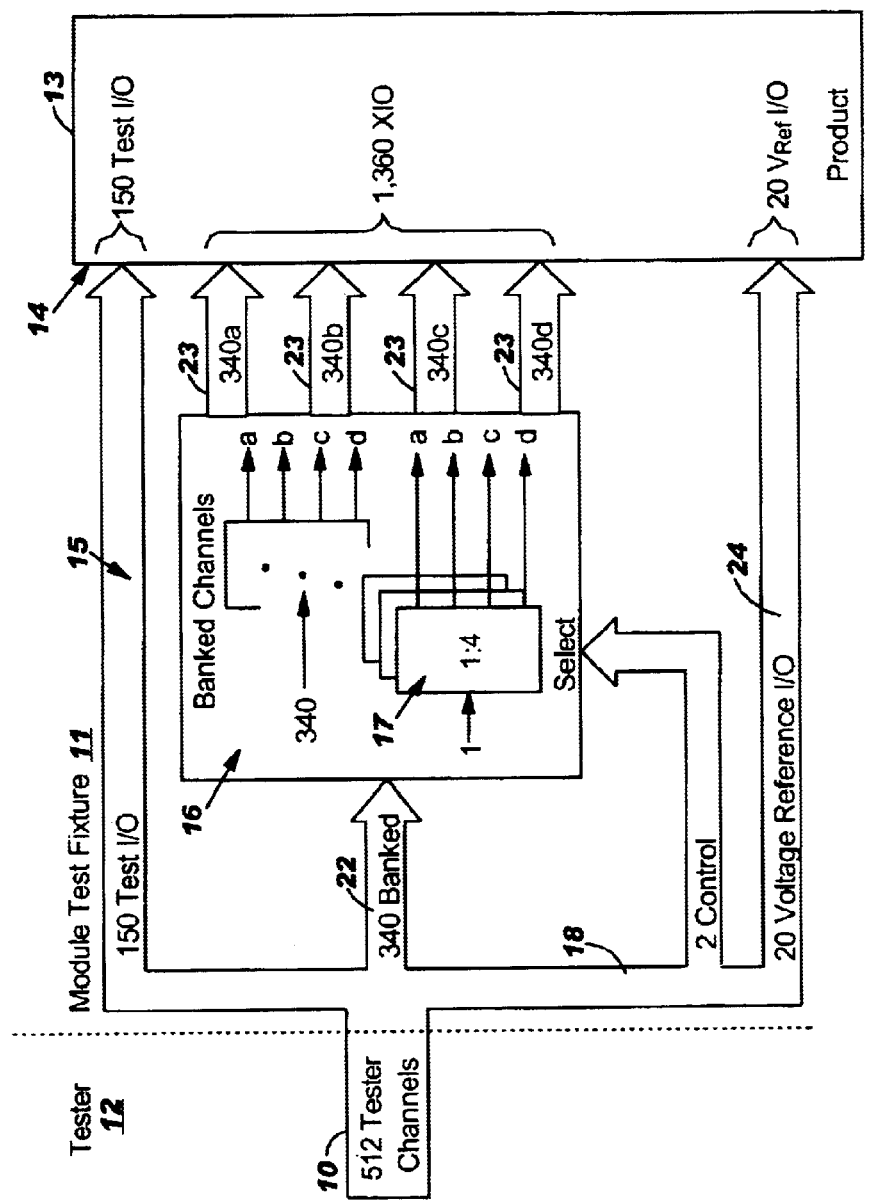
FIG. 2 is a schematic diagram of complex module banking.
Figure 3:
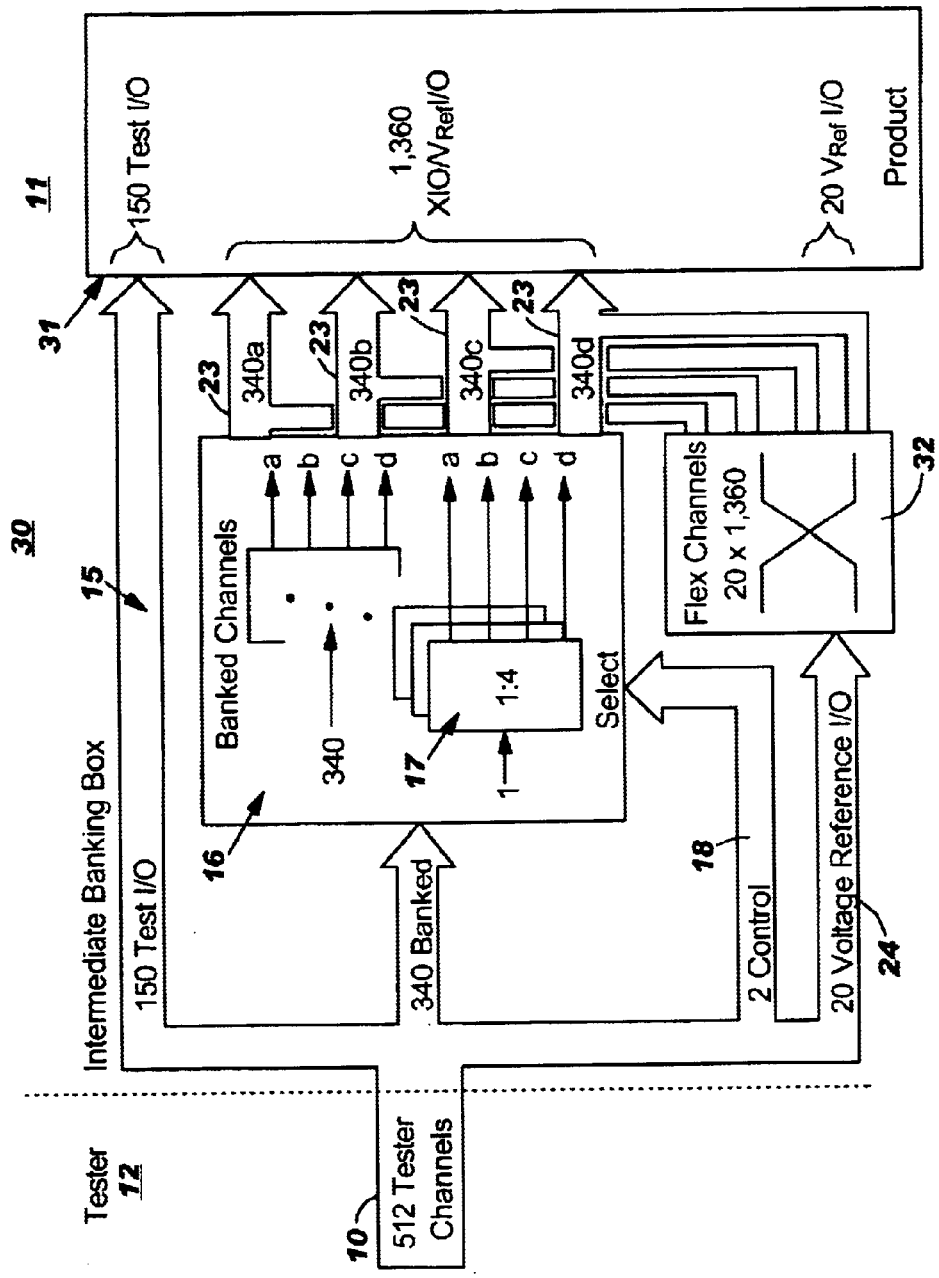
FIG. 3 is a schematic diagram illustrating the intermediate banking box with flex channels.

As shown in FIG. 3, another implementation of banking is to place the banking hardware into an intermediate banking box (IBB) 30 that resides between the tester 12 and the module test fixture 11 (which is connected to the product 13 as shown in FIGS. 1 and 2). One advantage of moving the switching circuitry 17 off the module test fixture to an intermediate box is that the switching circuitry setup becomes a one time up front cost. This avoids the repetitive costs and development lead-time of building custom module test fixtures 13 for high pin count ASICs.

An additional advantage of placing the banking hardware into an intermediate box 30 is that more space is available for the banking circuitry. Not only can the additional space be used for obtaining higher pin counts than that possible by banking on a module test fixture, but the additional space can also be used for additional hardware related to voltage reference I/O and differential I/O 24.

Recall that while the other types of external I/O 23 can be banked and tested as banked groups, the reference voltages are applied to these voltage reference I/O 24 throughout the duration of testing all the banks. In order to eliminate the need for fixed tester channels to support voltage reference I/Os "Flex Channels" 32 are added to the design. "Flex Channels" 32 are a cross-point switching network that allows a set of tester channels to connect to any of the external I/O pins 31 of the module test fixture 11 during any banking configuration. The number of tester channels required for the "Flex Channels" 32 is determined by the maximum number of voltage reference I/Os 24 supported by the ASIC technology.

In comparison to the banking on the module test fixture as shown in FIG. 2, two changes have been made. First, the banking circuitry now resides in an intermediate banking box 30, and all the tester channels are routed through the banking box 30 connecting to the module test fixture 11. Secondly, "Flex Channel" switches 32 are added to the design to route the twenty tester channels that are dedicated for voltage reference I/O 24 to any of the 1,360 external I/O pins 14 on the product 13. As a result, module test fixtures can now be more easily reused, where products have the same physical image with consistent placement of I/O pins. However, in order to assure that these test module fixtures are reusable, problems caused by differential I/O must be addressed. Also, note that a method to control the "Flex Channels" is needed. Controller circuitry placed within the IBB can be used to solve these problems.

As previously mentioned, differential I/O is a pair of external I/O pins that must be in a common bank, each with an active tester channel. Consider each banked tester channel as being routed through a 1:2n multiplexer. By using a simple n-bit control scheme to control 2n banks, where all the multiplexers have the same port selected, two problems can arise. First, each pin in the differential I/O pair can exist on different ports on different banked channels. Second, each pin in the differential I/O pair can exist on different ports on the same banked channel.

Figure 4:
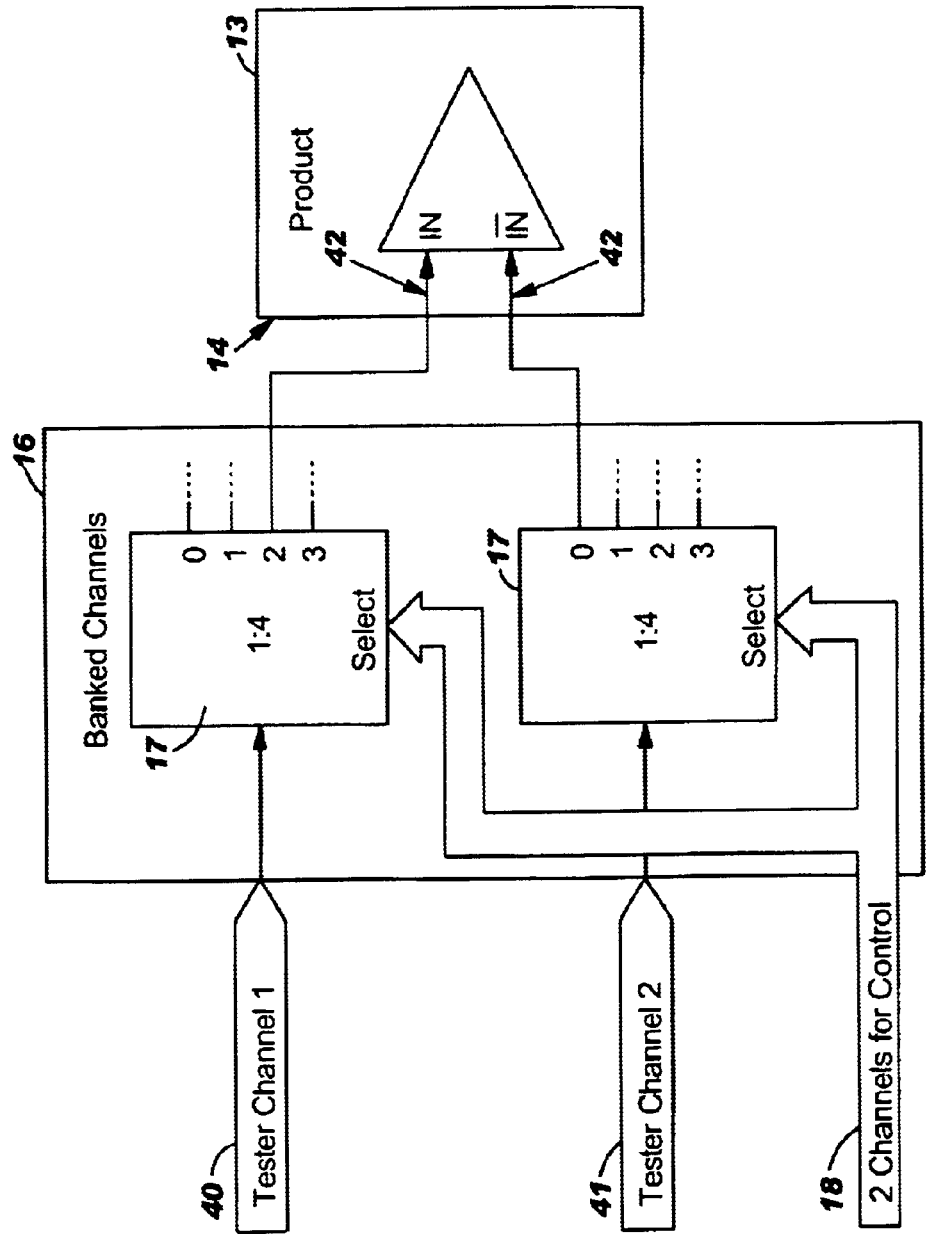
FIG. 4 is a schematic diagram illustrating a banking problem due to differential I/O pairs.

FIG. 4 illustrates the first differential I/O problem, different ports on different banks. This problem occurs when each pin 42 of a differential I/O pair is serviced by two different tester channels 40, 41 but on different ports (e.g., 0 and 2) of each multiplexer 17, preventing the use of a simple control scheme. By introducing a controller 50 connected to a communication bus 51 in the intermediate box, shown in FIG. 5, each banked tester channel can now be routed independently of all the other banked tester channels. This banking control technique is referred to as "Soft Banking".

Figure 5:
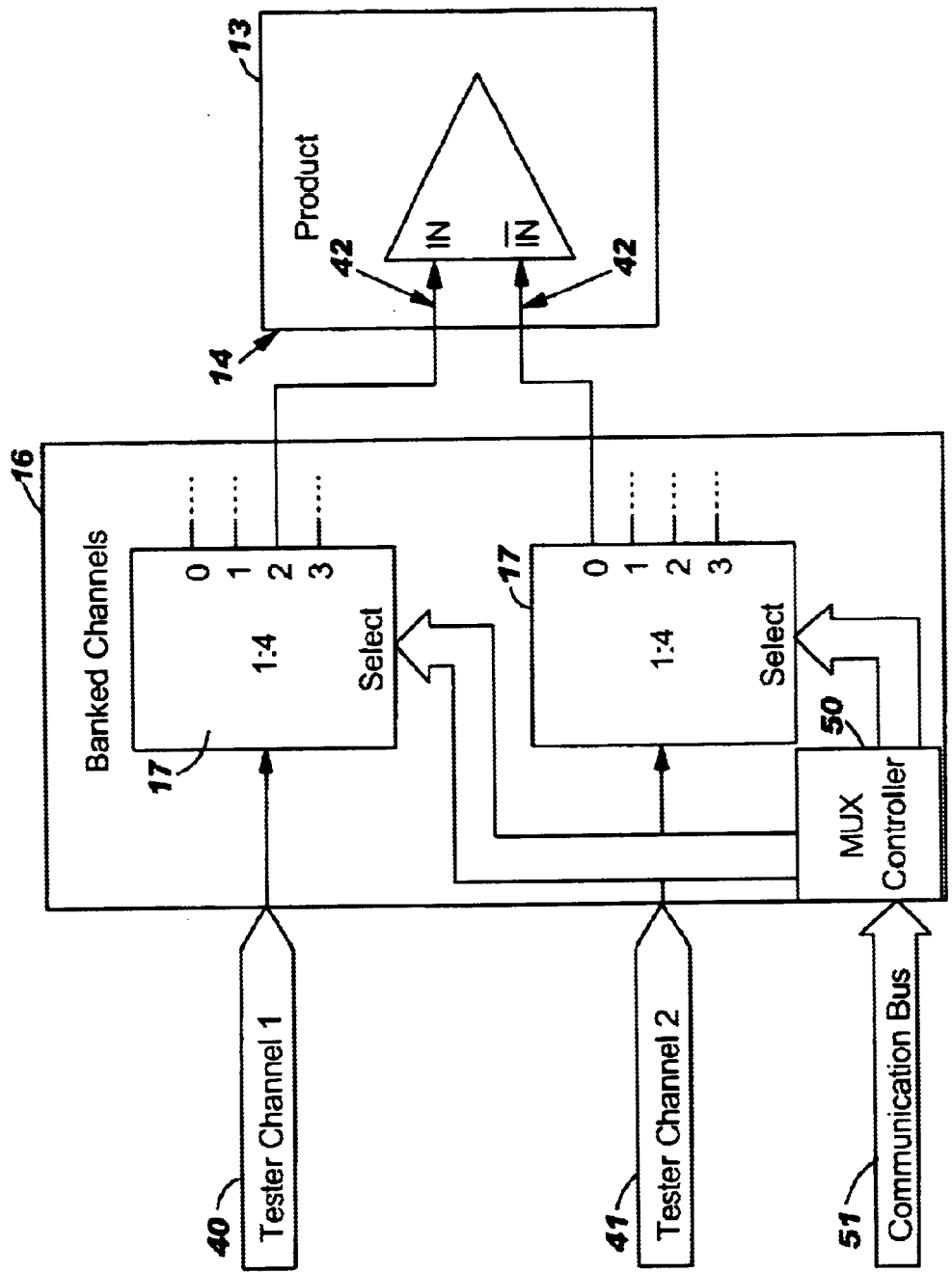
FIG. 5 is a schematic diagram illustrating a problem with differential I/O on different multiplexor ports.
Figure 6:
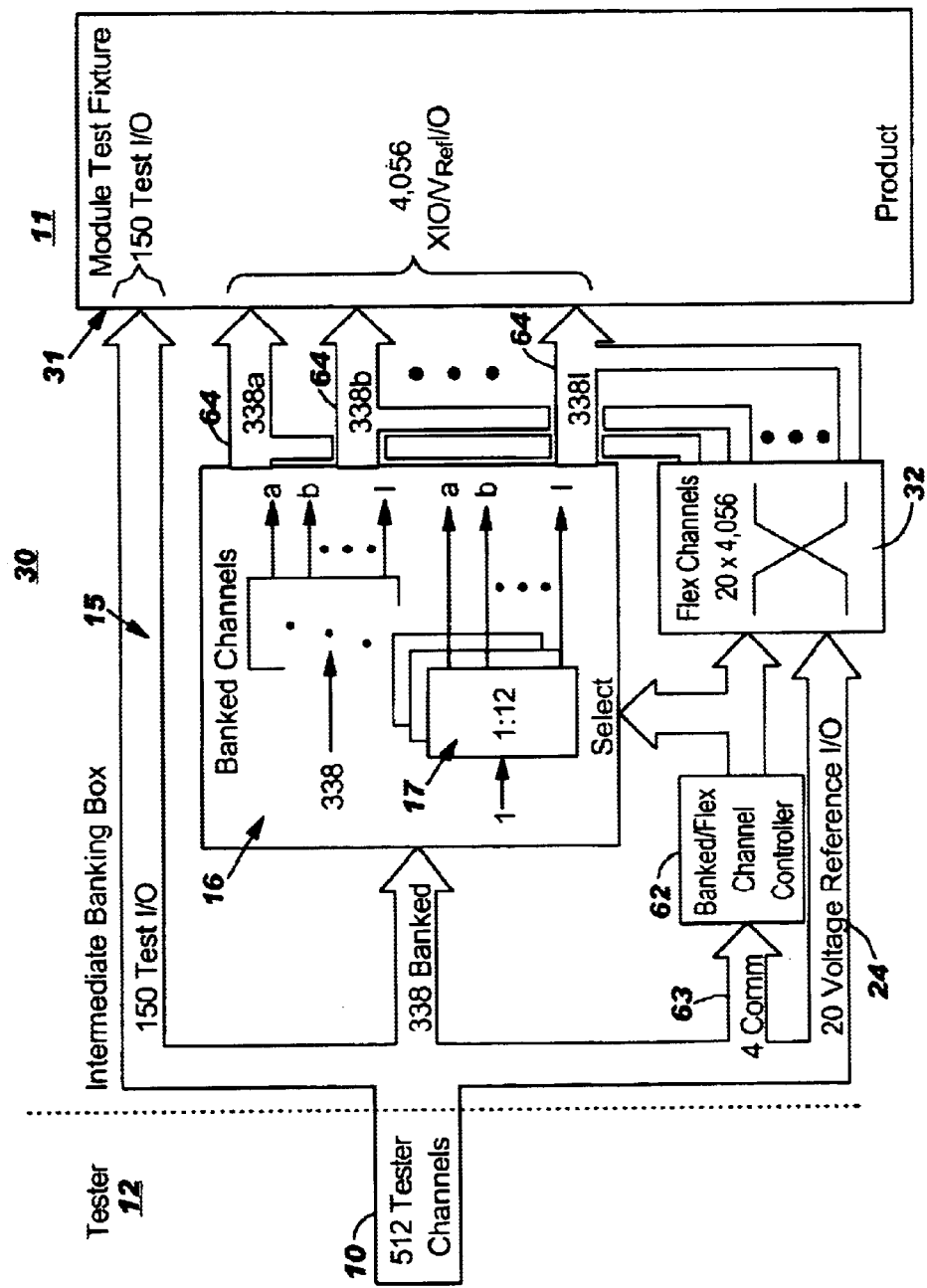
FIG. 6 is a schematic diagram illustrating an intermediate banking box with a multiplexor controller incorporated.

FIG. 4 shows the banking problem due to a differential I/O pair on different multiplexer ports using simple n-bit control scheme. FIG. 5 shows the differential I/O on different multiplexer port problem solved by using a controller 50 that accepts commands from the tester and can control each multiplexer 17 independently. The addition of the multiplexer controller 50 to the FIG. 3 example results in FIG. 6. The controller 62 in the FIG. 6 example uses serial communication and requires four channels 63, resulting in the banked channels 16 being reduced to 338 tester channels 64. However, because the intermediate banking box 30 can have much more area available for hardware, larger multiplexers can be used in the design. In this example, 1:12 multiplexers 60 are used with an appropriate controller 62 and the number of "Flex Channels" 32 is increased. The controller 62 is further modified to control the assignment of "Flex Channels" 32 to voltage reference I/O 24. As shown in FIG. 6, products with up to 4,206 I/O pins can be tested by a 512 pin tester 10.

Figure 7:
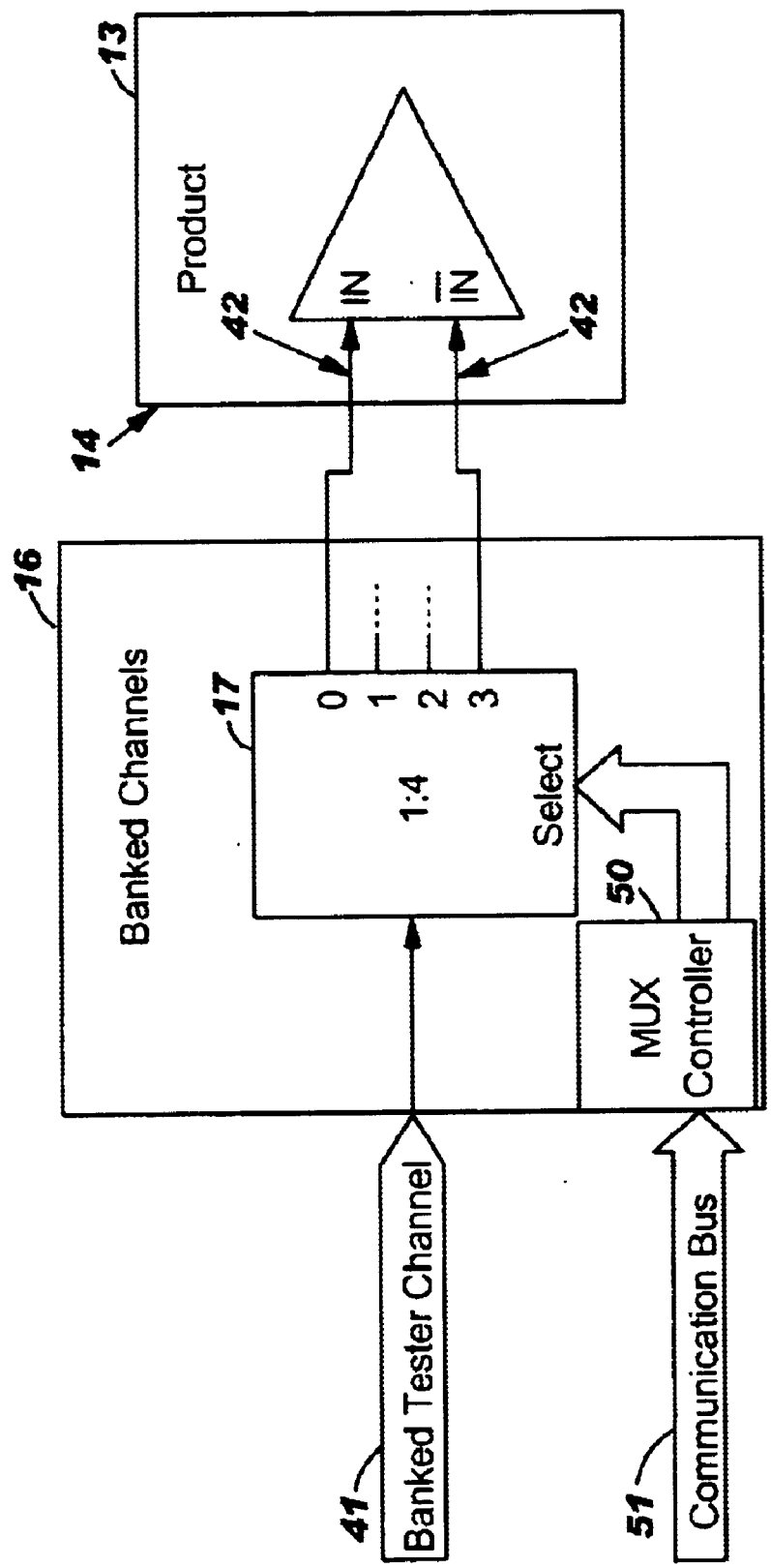
FIG. 7 is a schematic diagram illustrating a banking problem due to a differential I/O pair on different ports on the same multiplexor.
Figure 8:
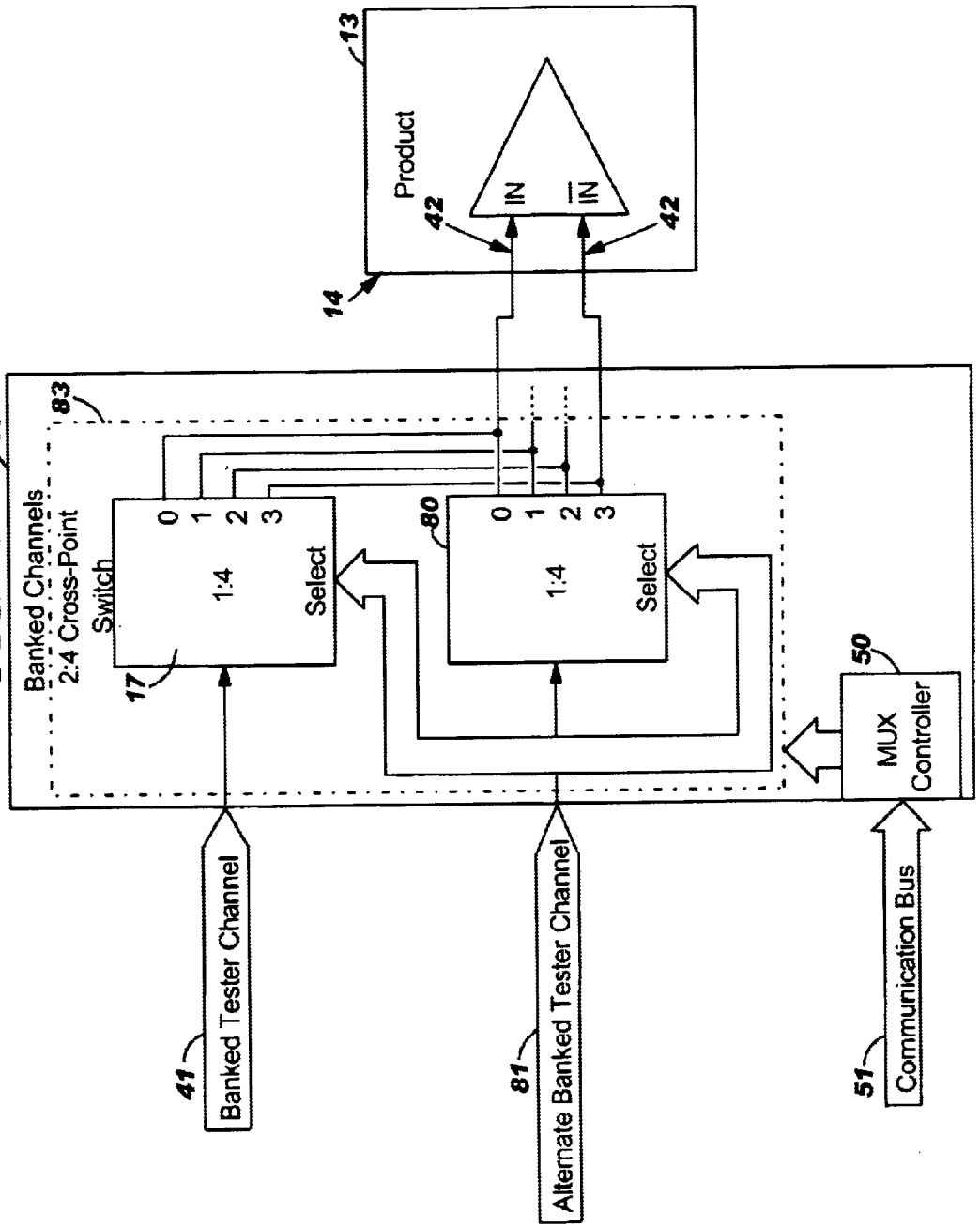
FIG. 8 is a schematic diagram illustrating a solution to the problem shown in FIG. 7.

FIG. 7 illustrates the other differential I/O problem. A product 13 can have a pair of the differential I/O 42 that are located on the same multiplexer 17 within the IBB 30. To solve this problem, as shown in FIG. 8, a second multiplexer 80 is placed in parallel with the "Banked Channel" multiplexer 70 forming a cross-point switch 83 that allows two tester channels 41, 81 to connect to any of the external I/O pins 14 in a banked group. This second banking path 81, as shown in FIG. 8, is referred to as the "Alternate Banked Channel" 80. Since a products design can place a differential I/O pair on the multiplexer 17 on a "Banked Channel" 41, the solution requires that "Alternate Banked Channels" 81 be used in conjunction with "Banked Channels" 41. Thus, FIG. 8 shows the differential I/O on same multiplexer problem solved by using a controller 50 that accepts commands from the tester and can control each multiplexer 17, 80 independently.

Figure 9:
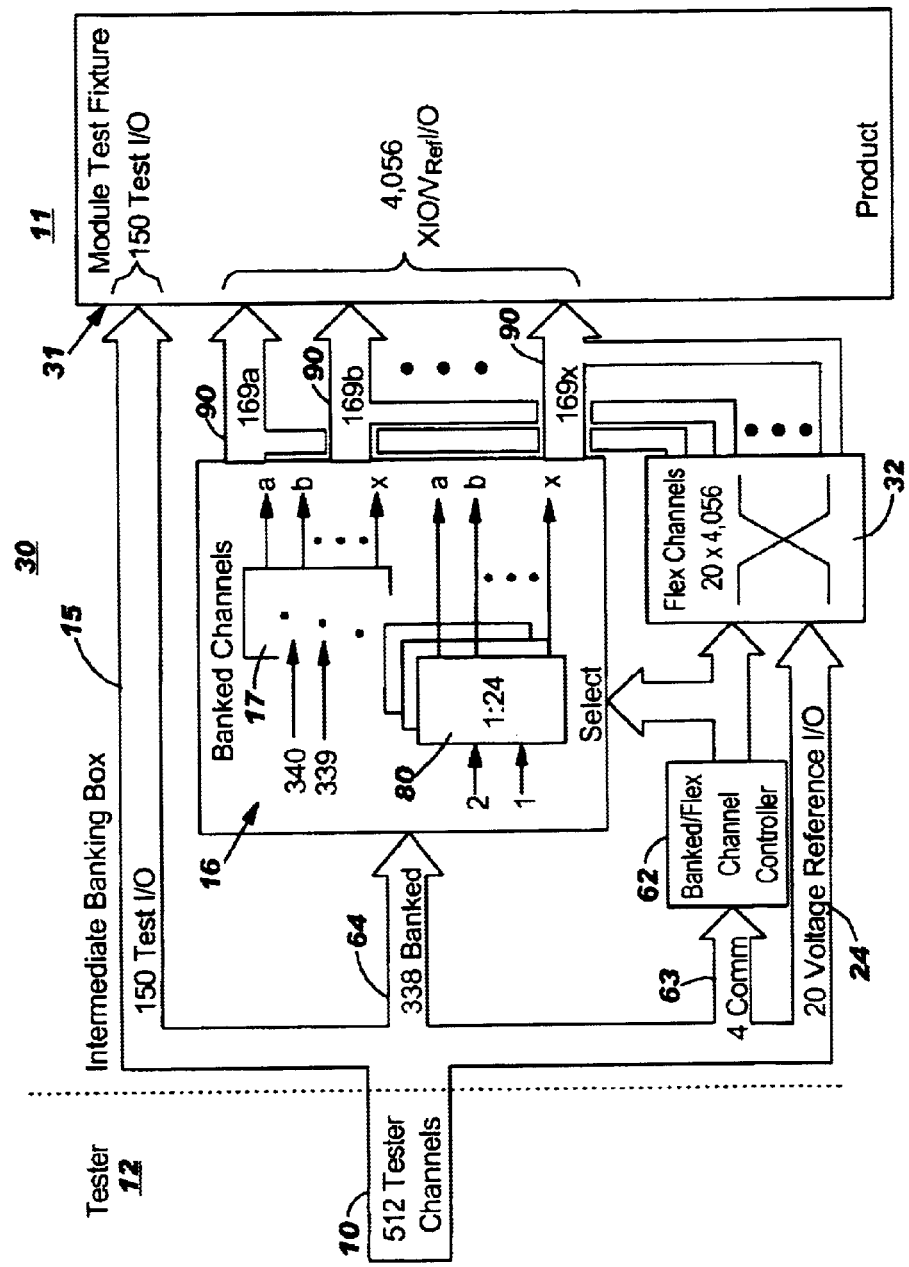
FIG. 9 is a schematic diagram illustrating an intermediate banking box with parallel multiplexors incorporated.

FIG. 9 shows the inclusion of the parallel multiplexers 17, 80. In order for the IBB 30 to continue to allow a tester 12 with 512 full functional tester channels 10 to test products 13 of up to 4,206 pins 14, 1:24 multiplexers 17, 80 with the appropriate controller 62 were used for banking. In the FIG. 9 example, 338 1:24 multiplexers (or 8,112 switches) would be needed for the "Banked" 41 and "Alternated Banked Channels" 81 and 4,206 1:20 multiplexers (or 8,112 switches) for the "Flex Channels" 32.

With the "Flex Channel" 32 and "Alternate Banking Channel" 81 switching schemes, along with "Soft Banking", the intermediate banking box 30 can be programmed to handle the ASICs special banking requirements described earlier. The need for many custom module test fixtures 11 is reduced to just one fixture per product image. The module test fixtures 11 need not contain banking circuitry customized to individual ASIC products. The intermediate banking box 30 precludes the cost of several custom module test fixtures 11 each with expensive banking circuitry.

As described above, banking can be implemented on the module test fixture 11 or with an intermediate banking box 30 that is placed between the tester 12 and the module test fixture 11. Both of these approaches work with existing ATE (Automated Test Equipment). However, future Design for Test (DFT) testers could implement the banking switching, programming, and calibration support within the tester.

Automatic Test Pattern Generation (ATPG) can be used to bank the External I/O test patterns such that they can be applied on the low pin count testers using a banked module test fixture. Through the early 1990's banked External I/O test patterns were used. The ATPG of External I/O test patterns for that earlier banking method assumed that, at most, just one external I/O pin could receive a stimulus during a test pattern. For every external I/O pin, the three receiver parametric tests of logic 1, and 0 were each generated as a separate test pattern. The driver parametric test patterns were allowed to measure any number of pins. Manufacturing test could then organize the receiver tests into the banked pattern sets conforming to the banked pin groups defined by the module test fixture. The receiver tests were banked into pattern sets, each containing the tests for the pins in a banked group. The driver tests were included in all the grouped pattern sets. Measures within the driver tests were ignored when the measured pin was not active in a particular group. Since every external I/O pin was active in at least one group, every pins receiver and driver tests are applied by one of the banked pattern groups. The complete independence of the external I/O pins and their test patterns also allowed banked module test fixtures to be shared by products with the same physical size and image.

The earlier banking method was made obsolete by the evolving ASIC technology offerings. It had allowed stimulus to be applied to, at most, one external I/O pin by each test within the External I/O test patterns. In 1995, an ASIC technology introduced differential I/O pins and special voltage reference I/O pins. During the external I/O tests, these special types of external I/O require multiple pins to be simultaneously contacted and to receive stimuli. This complicates the coordination of the customers test generation and the use of banking for manufacturing test. These special types of interdependent external I/O must be together in one bank. However, an ASIC customers product design and test pattern generation occurs well before the manufacturing module test fixture is defined.

ATPG tools do not support importing information about the physical location of the chip I/Os and their module pin mapping. Test generation uses a logical model of a chip and its I/O. The actual physical location of these I/O on the chip is defined separately by the physical design process. In addition, the secondary mapping of the chip I/O to module pins is defined by yet another process, the design of the module substrate. In some cases, the same product can be packaged on different module substrates.

It is logistically impractical for a test fixtures banking configuration to be "backed" through the module substrate design and the physical design definition of chip pad locations to the ATPG logical test pins. Hence, it is impractical for the customers ATPG to have the forward knowledge of how the external I/O pins will be banked by manufacturing. It is after test generation and module substrate definition that manufacturing can best define "banked" pin groups and build a banked module test fixture. The external I/O "banked" pin groups are determined by cross-referencing the ATPG logical test pins to their physical chip pad locations and, in turn, to the module pin locations on the module substrate. The ATPG logical model and the chip and module physical design models are used to determine the fixed physical locations of the multiple pins that need to be simultaneously contacted.

Since the customers test generation lacks the physical information required to determine banking, the "practical solution" has been to have the ATPG assume all pins would be contacted by a high pin count tester. This undesired "solution" began in 1995, and has required the purchase of high pin count testers to test the higher pin count products.

As manufacturing gets future orders for high pin count and high volume products, the continued economic interest is to minimize capital costs and production costs by testing the product on existing testers or less expensive testers with fewer tester channels then the product has pins. Because of the special I/O pins described above, customers test generation for the external I/O tests will continue to be run to with the assumption that the tester will contact all the product pins simultaneously. However, after receiving the test patterns, manufacturing can use the inventive banking method to modify the external I/O test patterns such that they can be applied on testers with fewer test channels using custom banked test fixtures or an intermediate banking board.

The inventive banking method handles the measures within the external I/O driver tests in the same fashion as the earlier method. However, by utilizing re-simulation of the suitably modified external I/O test patterns, the method does not restrict the tests to just one stimulus per test pattern on the external I/O pins. Any and all of the pins in the active bank can have stimuli applied by one of the re-simulated test patterns. Since the customers test generation is done assuming all pins will be contacted then there are many fewer test patterns each containing stimuli on many external I/O pins. Consequently, even after replication of the external I/O test patterns for each bank, the net result is that the modified and re-simulated external I/O test patterns are far fewer in number and will require less time to apply in comparison to the earlier banking method.

Banking external I/O parametric tests is made possible by of the following ASIC design and test characteristics. ASIC Boundary Scan Design Rules restrict the wiring and logic outboard of the boundary scan chains in such a fashion that the outboard circuitry and the test patterns generated for it are distinctly disciplined and structured. External I/O test patterns generated assuming full pin count test for products that use ASIC Boundary Scan Design Rules have the unique characteristics that allow them to be modified and re-simulated such that they can be applied using a "banked" external I/O test methodology. For typical external I/O pins in the parametric test patterns, the ASIC Boundary Scan Design Rules cause the preconditioning of each parametric fault objective on typical external I/O to be entirely independent of the preconditioning for other parametric fault objectives. When one test pattern contains the tests of many parametric faults, the preconditioning and test of individual parametric faults can be separated from that original test pattern and regrouped into two or more "banked" test patterns. Thereby, each full pin count test pattern can be separated into "banked" test patterns. The future introductions of other types of external I/O with special interdependencies are highly unlikely to compromise this banking test methodology. This method allows all pins that are continuously contacted plus all pins in a given bank to have stimuli and measures within the same test pattern. In order to compromise this methodology, the number of external I/O on a product with such an interdependency would have to exceed the number of pins in the union of the group of continuously contacted pins and a "banked" group of pins. Since manufacturing test will assign each of the ASIC products external I/O pins to banks, the "banking" algorithm can both recognize any interdependencies of the products external I/O, and also optimize the banked pin groups for the banking implementation being used. When using module test fixtures, the banking can allow for the reuse or modification of existing module test fixtures. Alternately, it can facilitate the design, fabrication and turn around time of the inventions module test fixture. When using the intermediate banking box, the banking algorithm can exploit the redundancy of the primary, alternate, and flex channels. Differential I/O pins and Voltage Reference I/O pins do place certain constraints on how the pins are placed in "banked" pin groups. External I/O with interdependencies will be "banked" together such that they are simultaneously contacted. ASIC Boundary Scan Design Rules allow the customers external I/O test patterns to be modified and re-simulated into banked test patterns without need to repeat either test generation or fault machine simulation. The structural nature of the ASIC Boundary Scan Design requires only good machine simulation (GMS) after the full pin count test patterns and their parametric preconditioning has been separated into "banked" test patterns. The ASIC Boundary Scan Design ensures that when external I/O test patterns are separated into "banked" test patterns and re-simulated, there is no loss of parametric fault coverage. The existing logical test data, physical design data and module description that is currently received by manufacturing test contains all the information required to determine the pin banking, and re-simulate full pin count external I/O test patterns into "banked" external I/O test patterns.

The customer will continue to design the product, run test generation, and submit the external I/O test patterns without knowledge of the banking configuration that will later be determined by manufacturing. Each test in the test patterns may contain any number of stimuli and measures on the external I/O pins. As provided by the customer, the external I/O test patterns obtain high parametric fault coverage and require a full pin count tester.

The first process described below analyzes an ASIC products physical design data, logical test data, and module description. It recognizes the presence of differential I/O, voltage reference I/O and any other types of I/O that have special banking restrictions. The banking constraints required for these exceptional types of I/O pins is defined to the process by a set of rules. Rules can also be included which define guidelines that allow design/build optimization and reuse of module test fixtures or the programming of the channel assignments within the intermediate banking box. For a high pin count ASIC, this process generates a list of allowable banking configurations for the product. Multiple "banking" configurations are possible for each ASIC. With this flexibility, two or more ASIC products can be "banked" in the same configuration. The most general "banked" configuration for ASICs with a common physical image can be used allowing multiple products to share the banking configuration and hardware.

The second described process is the method of modifying the customers full pin count External I/O test patterns into reduced pin count External I/O test patterns that use the "banked" pin groups. The process creates sets of banked test patterns that conform to the banking configuration defined by the first process. Using banking, the test patterns can be applied on a tester with fewer channels then the product has pins. The resulting test preserves the full parametric fault coverage and test quality of the customers original test pattern set.

To determine the banking process first the invention must first read pin data from the TMD and determine the logical to physical pin correlation from a file that contains the physical location of each logical I/O chip pin. Then, working within the "restrictions of banking" as they relate to test I/O, external I/O, differential I/O, voltage reference I/O, and any other exceptional types of external I/O pins with special interdependencies define the external I/O "banked" pin subsets required for the specific part being processed. Then, the invention generates the instruction set for the intermediate banking box that will program the assignment of the banked, alternate and flex channels for the specific part. Alternately, if a banked module test fixture is to be used, the invention refers to a table of existing module test fixtures to identify opportunities for reuse and guidelines that address design optimization for the inventive or modified module test fixtures. Then the invention generates a list of "banked" pin groups for the product and, if available, which existing fixture to use. If a module test fixture with this configuration does not already exist, the invention uses these "banked" pin groups as the basis for the design of the inventive module test fixture or modification of an existing one.

To arrange and re-simulate external I/O Test Patterns the invention uses a second process by using the lists of the external I/O "banked" pin groups and the customers original external I/O test patterns, sets aside a backup copy of the original test patterns and initiates modification of the original pattern set by making the inventions copy of the external I/O test patterns for each "banked" pin group. First, for each "banked" copy of test patterns the invention removes all the stimuli on external I/O pins that are not in the "active" bank, replaces all the measure latch events with measure X, and replaces all the primary output measures with measure X.

Then, the invention does a Good Machine Simulation, GMS, is on each "banked" copy of the test patterns. The GMS reestablishes measures in each "banked" copy of the test patterns. These measures are no longer dependent on any stimuli on pins in an "inactive" bank.

For each "banked" pattern set, the invention removes all primary output measures on "inactive" (out-of-bank) pins. Every primary output measure in the original pattern set will be retained in at least one of the "banked" pattern sets. The "banked" copies of the test patterns also contain preconditioning from the latch stimuli events. The preconditioning from these latch stimuli is for the "driver" tests of all the external I/O pins. After the GMS, each of the "banked" copies of the test patterns will contain "driver" test measures on all the external I/O pins. Each "banked" copy will have these measures on both its "active" (in-bank) and "inactive" (out-of-bank) pins. Within these "banked" copies, those measures on the "inactive" (out-of-bank) pins are removed. In one "banked" copy of the test patterns, they are guaranteed to be "active" (in-bank) and thus remain as active measures. Each measure need only be done once to preserve the parametric fault coverage of the original pattern set. The invention removes any tests that contain no measures on latches or primary outputs after being grouped and re-simulated. The invention converts the re-simulated ATPG external I/O test patterns into the testers required pattern syntax, and builds a "banked" test program for the low pin count tester.

Every stimulus and measure on an external I/O pin in the original set of test patterns will be contained in at least one of the "banked" test patterns. In turn, all of external I/O parametric faults tested by the original test patterns are tested by one of the "banked" copies of the re-simulated external I/O test patterns. Since the ASIC Boundary Scan Design and the methods used protect the parametric faults through the course of this process, the customers test quality is retained. The sum of these parts is equal to the original whole. Using ASIC Boundary Scan Design to bank external I/O test patterns allows high pin count products to be fully tested on low pin count testers. This ASIC design and test method serves to avoid the high costs associated with high pin count testers.

While the invention has been described in terms of preferred embodiments, those skilled in the art will recognize that the invention can be practiced with modification within the spirit and scope of the appended claims.

What is claimed is:

1. An integrated circuit chip test apparatus comprising:
a module test fixture having contact pads, wherein said contact pads are adapted to make contact with signal input/output pins on an integrated circuit chip being tested;

an intermediate banking box connected to said module text fixture; and a tester connected to said intermediate banking box, wherein said tester includes at least one bank of channels, wherein there are more of said pins on said integrated circuit chip than there are said channels in said tester, wherein said intermediate banking box includes switches connected between said contact pads and said channels, and wherein said switches are adapted to selectively connect a subset of said contact pads to said channels to connect said tester to a subset of said pins, thereby allowing said tester to test a portion of said integrated circuit that corresponds to said subset of pins.

2. The apparatus in claim 1, wherein selected dedicated channels of said channels are dedicated to specific ones of said pins and are not switched to different pins during chip testing.

3. The apparatus in claim 2, wherein said dedicated channels comprise flex channels that can change which pin connections said dedicated channels are dedicated to when testing different types of chips.

4. The apparatus in claim 1, wherein said intermediate banking box comprises a plurality of banks of said channels and further comprises a multiplexor controller for coordinating the connections of said banks.

5. The apparatus in claim 4, wherein said banks are connected in parallel within said banking box.

6. The apparatus in claim 1, wherein a full chip test program supplied to said tester is modified by said tester such that said tester sequentially applies portions of said full chip test program to portions of said integrated circuit as limited by the number of channels.

7. The apparatus in claim 1, wherein said intermediate banking box is adapted to be connected to a plurality of different module text fixtures associated with different types of integrated chips to be tested, such that said intermediate banking box can be used to test a plurality of different pin style integrated circuit chips.

8. An integrated circuit chip test apparatus comprising:

a module test fixture having contact pads, wherein said contact pads are adapted to make contact with signal input/output pins on an integrated circuit chip being tested;

a tester connected to said module test fixture, wherein said tester includes at least one bank of channels, wherein there are more of said pins on said integrated circuit chip than there are said channels in said tester, wherein said tester also includes switches connected between said contact pads and said channels, and wherein said switches are adapted to selectively connect a subset of said contact pads to said channels to connect said tester to a subset of said pins, thereby allowing said tester to test a portion of said integrated circuit that corresponds to said subset of pins.

9. The apparatus in claim 8, wherein selected dedicated channels of said channels are dedicated to specific ones of said pins and are not switched to different pins during chip testing.

10. The apparatus in claim 9, wherein said dedicated channels comprise flex channels that can change which pin connections said dedicated channels are dedicated to when testing different types of chips.

11. The apparatus in claim 8, wherein said switches comprise a plurality of banks of said channels and further comprise a multiplexor controller for coordinating the connections of said banks.

12. The apparatus in claim 11, wherein said banks are connected in parallel.

13. The apparatus in claim 8, wherein a full chip test program supplied to said tester is modified by said tester such that said tester sequentially applies portions of said full chip test program to portions of said integrated circuit as limited by the number of channels.

14. The apparatus in claim 8, wherein said tester is adapted to be connected to a plurality of different module text fixtures associated with different types of integrated chips to be tested, such that said intermediate banking box can be used to test a plurality of different pin style integrated circuit chips.

15. An integrated circuit chip test apparatus comprising:

a module test fixture having contact pads, wherein said contact pads are adapted to make contact with signal input/output pins on an integrated circuit chip being tested;

an intermediate banking box connected to said module text fixture; and a tester connected to said intermediate banking box, wherein said tester includes at least one bank of channels, wherein there are more of said pins on said integrated circuit chip than there are said channels in said tester, wherein said intermediate banking box includes switches connected between said contact pads and said channels, wherein said switches are adapted to selectively connect a subset of said contact pads to said channels to connect said tester to a subset of said pins, thereby allowing said tester to test a portion of said integrated circuit that corresponds to said subset of pins, and wherein said intermediate banking box is adapted to be used with a plurality of different module test fixtures and testers.

16. The apparatus in claim 15, wherein selected dedicated channels of said channels are dedicated to specific ones of said pins and are not switched to different pins during chip testing.

17. The apparatus in claim 16, wherein said dedicated channels comprise flex channels that can change which pin connections said dedicated channels are dedicated to when testing different types of chips.

18. The apparatus in claim 15, wherein said intermediate banking box comprises a plurality of banks of said channels and further comprises a multiplexor controller for coordinating the connections of said banks.

19. The apparatus in claim 18, wherein said banks are connected in parallel within said banking box.

20. The apparatus in claim 15, wherein a full chip test program supplied to said tester is modified by said tester such that said tester sequentially applies portions of said full chip test program to portions of said integrated circuit as limited by the number of channels.

* * * * *